(12) United States Patent
Kim et al.

(10) Patent No.: US 7,417,903 B2
(45) Date of Patent: Aug. 26, 2008

(54) CORE VOLTAGE GENERATOR AND METHOD FOR GENERATING CORE VOLTAGE IN SEMICONDUCTOR MEMORY DEVICE

(75) Inventors: Ki-Ho Kim, Kyoungki-do (KR); Kyung-Whan Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 27 days.

(21) Appl. No.: 11/478,086

(22) Filed: Jun. 30, 2006

(65) Prior Publication Data

US 2007/0070719 A1    Mar. 29, 2007

(30) Foreign Application Priority Data

Sep. 29, 2005    (KR)    ............ 10-2005-0091688
Dec. 29, 2005    (KR)    ............ 10-2005-0133987

(51) Int. Cl.
G11C 5/14    (2006.01)

(52) U.S. Cl. ............................................. 365/189.09
(58) Field of Classification Search ............ 365/189.09, 365/204, 226
See application file for complete search history.

(56) References Cited

U.S. PATENT DOCUMENTS

| | | | | |
|---|---|---|---|---|
| 5,091,886 | A * | 2/1992 | Miyawaki et al. | 365/204 |
| 5,241,502 | A * | 8/1993 | Lee et al. | 365/203 |
| 5,260,904 | A * | 11/1993 | Miyawaki et al. | 365/189.06 |
| 5,289,063 | A * | 2/1994 | Orisaka et al. | 327/393 |
| 5,687,123 | A * | 11/1997 | Hidaka et al. | 365/189.09 |
| 6,043,685 | A | 3/2000 | Lee | |
| 6,169,698 | B1 | 1/2001 | Sukegawa et al. | |
| 6,301,177 | B1 * | 10/2001 | Chung | 365/204 |
| 6,600,692 | B2 * | 7/2003 | Tanzawa | 365/226 |
| 6,717,880 | B2 * | 4/2004 | Jeong | 365/227 |
| 6,778,460 | B1 | 8/2004 | Jung | |
| 6,865,125 | B2 * | 3/2005 | Tanzawa et al. | 365/200 |
| 6,940,744 | B2 * | 9/2005 | Rinerson et al. | 365/148 |
| 7,068,547 | B2 * | 6/2006 | Do | 365/189.11 |

(Continued)

FOREIGN PATENT DOCUMENTS

JP    2001-216779 A    8/2001

OTHER PUBLICATIONS

Yannis P. Tsividis, Operation and Modeling of The MOS Transistor, 1987, McGraw-Hill, pp. 200-202.*

*Primary Examiner*—Hoai V. Ho
*Assistant Examiner*—Jay Radke
(74) *Attorney, Agent, or Firm*—McDermott Will & Emery LLP

(57) ABSTRACT

Provided are a core voltage generator and a method for generating a core voltage in a semiconductor memory device. The core voltage generator includes a first discharge driver for discharging a core voltage terminal for an interval at which the voltage is higher than a target level, in response to a first enable signal activated for a first predetermined period after overdriving a bit line, and a second discharge driver for discharging the core voltage terminal for an interval at which the voltage at the core voltage terminal is higher than the target level by a predetermined threshold, in response to a second enable signal activated for a second predetermined period after overdriving the bit line, wherein the second predetermined period is shorter than the first predetermined period.

8 Claims, 4 Drawing Sheets

U.S. PATENT DOCUMENTS

2005/0231269 A1   10/2005   Kim et al.
2005/0281094 A1   12/2005   Seo

2006/0140020 A1 *  6/2006   Do ........................ 365/189.11

* cited by examiner

CORE VOLTAGE GENERATOR AND METHOD FOR GENERATING CORE VOLTAGE IN SEMICONDUCTOR MEMORY DEVICE

FIELD OF THE INVENTION

The present invention relates to a semiconductor design technology, and more particularly, to a core voltage generator and a method for generating a core voltage in a semiconductor memory device.

DESCRIPTION OF RELATED ART

In a semiconductor memory device, a bit line sense amplifier is a circuit that is configured to amplify data provided from a memory cell or a segment input/output line to a bit line. The bit line sense amplifier is connected to a pair of bit lines and employs a pull-up power line and a pull-down power line to sense a voltage difference between the pair of bit lines and then amplify the voltage into a core voltage level and a ground voltage level.

However, a core voltage applied to the pull-up power line allows the sensing efficiency and capability to be limited. In recent years, therefore, an external power supply voltage with a higher level than that of the core voltage is supplied to the pull-up power line for a preset time.

Performing the amplification by applying the external power supply voltage to the pull-up power line as described above is called an overdriving operation of the bit line sense amplifier.

After the overdriving operation is ended, the core voltage is again provided to the pull-up power line instead of the external power supply voltage. At this time, a voltage level on the pull-up power line that has risen due to the external power supply voltage applied thereto makes it difficult to recover a desired voltage level, i.e., a target core voltage level.

FIG. 1 is a graph showing a voltage level of a pull-up power line of a conventional bit line sense amplifier.

Referring to FIG. 1, the voltage level of the pull-up power line after the overdriving operation has risen by ΔV1 because of an inflow of current caused by a supply of an external power supply voltage.

For stability of leakage current of a transistor in the circuit and the voltage level of the core voltage over time, the core voltage that has risen by ΔV1 is discharged by an extremely slight amount ΔV2 through a discharge transistor included in a core voltage driver circuit.

Consequently, there has been a need for a discharge driver that makes the raised core voltage level fall to a target core voltage.

SUMMARY OF THE INVENTION

It is, therefore, an object of the present invention to provide a core voltage generator and a method for generating a core voltage in a semiconductor memory device for effectively decreasing a voltage level of core voltage, which had increased due to an overdriving operation of a sense amplifier, to a target core voltage level.

In accordance with the present invention, there is provided a core voltage generator in a semiconductor memory device, including: a first discharge driver for discharging a core voltage terminal for an interval during which the voltage at the core voltage terminal is higher than a target level, in response to a first enable signal activated for a first predetermined period from an overdriving end time of a bit line; and a second discharge driver for discharging the core voltage terminal for an interval at which the voltage at the core voltage terminal is higher than the target level by a predetermined threshold, in response to a second enable signal activated for a second predetermined period from the overdriving end time of the bit line, wherein the second predetermined period is shorter than the first predetermined period.

Other objectives and advantages of the invention will be understood by the following description and will also be appreciated by the embodiments of the invention more clearly.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be described in detail referring to the accompanying drawings to the extent that the invention can be readily carried out by those in the art to which the invention pertains.

Figure 1:
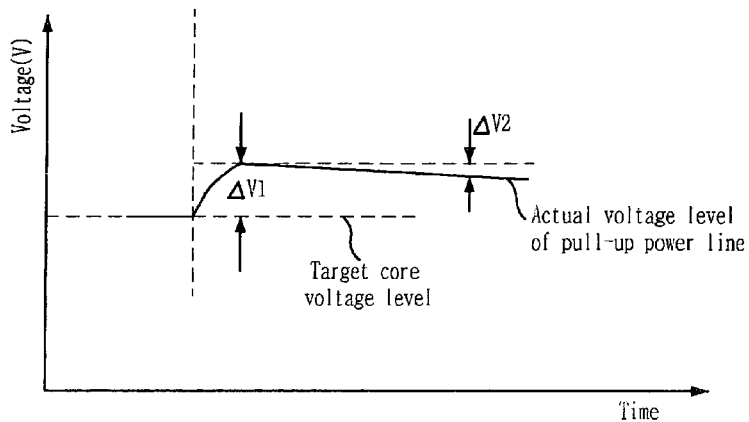
FIG. 1 is a graph showing a voltage level of a pull-up power line of a conventional bit line sense amplifier.
Figure 2:
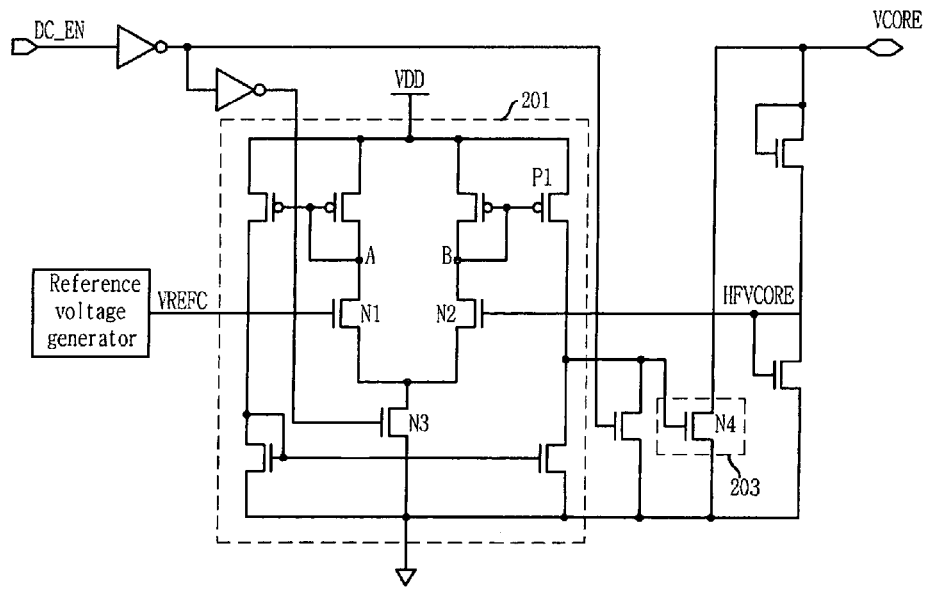
FIG. 2 is a schematic circuit diagram describing a core voltage generator in accordance with an embodiment of the present invention.

FIG. 2 is a schematic circuit diagram describing a core voltage generator in accordance with an embodiment of the present invention.

Referring to FIG. 2, the core voltage generator includes a comparator 201 for comparing a half core voltage HFVCORE that is ½ level of a core voltage with a reference voltage VREFC, which is a ½ level of a target core voltage, provided by a reference voltage generator, and a discharge driver 203 for discharging a core voltage terminal in response to an output signal of the discharge driver 203.

In this configuration, a comparator enable signal DC_EN as an enable signal of the comparing unit 201 is activated to a logic high level when an overdriving operation is ended, and maintained at the logic high level for a certain time for discharge.

Briefly explaining operation of the core voltage generator, the comparator enable signal DC_EN is first activated to a logic high level and a third NMOS transistor N3 is enabled; and thus, a differential comparator of the comparator 201 is driven.

Subsequently, input to a gate of a second NMOS transistor N2 is a half core voltage HFVCORE, which is a ½ level of a core voltage at a core voltage terminal, having a greater voltage level than the target core voltage due to the overdriving operation of the sense amplifier. Also applied to a gate of a first NMOS transistor N1 is a reference voltage VREFC that is ½ of the target core voltage.

At this time, since a voltage level of the half core voltage HFVCORE that is ½ of the risen core voltage is higher than that of the reference voltage VREFC, the second NMOS transistor N2 is conductive at a high current compared to the first NMOS transistor N1, thereby lowering a voltage level at a node B.

Therefore, a first PMOS transistor P1 is turned on, and lastly, an output signal of the comparator 201 becomes a logic high level. The output signal of logic high level is then applied to a gate of a fourth NMOS transistor N4 of the discharge driver 203. Transistor N4 is turned on to permit discharge at core voltage terminal VCORE.

At this time, a discharging rate at the core voltage terminal becomes fast if the fourth NMOS transistor N4 is large in size, and conversely slow if it is small.

Figure 3A:
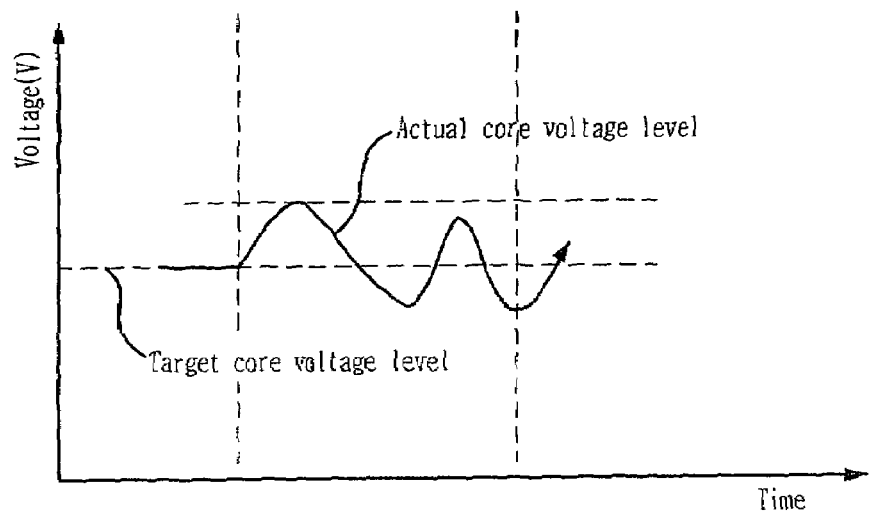
FIGS. 3a and 3b are graphs showing a core voltage level when the discharge driver of FIG. 2 is driven.
Figure 3B:
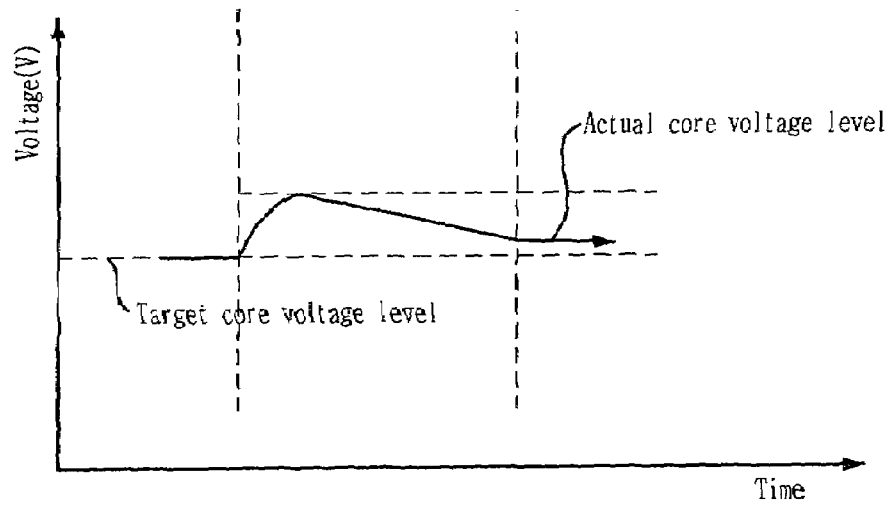

FIGS. 3a and 3b are graphs showing a core voltage level when the discharge driver of FIG. 2 is driven. An explanation will be given with the same reference numerals as those of FIG. 2.

FIG. 3a represents a case in which the size of the fourth NMOS transistor N4 in the discharge driver 203 is large. In this case, a core voltage supplier is driven to correct a voltage level dropped below the target core voltage level due to an excessive discharge, which takes place by a fast discharging rate at a core voltage terminal. However, since the core voltage supplier also elevates the voltage level at the core voltage terminal above the target core voltage level, the discharge driver is again driven and this operation is repeated, which yields a ringing phenomenon that allows the core voltage VCORE to fluctuate, as shown in the graph of FIG. 3a.

FIG. 3b depicts a case in which the size of the fourth NMOS transistor N4 of the discharge driver 203 is small. It can be seen in FIG. 3b that the voltage level at the core voltage terminal does not drop to the target core voltage level. Because the voltage level at the core voltage terminal continuously rises and the discharge rate at the core voltage terminal is slow, the voltage does not go down to the target core voltage level prior to a following overdriving operation.

Figure 4:
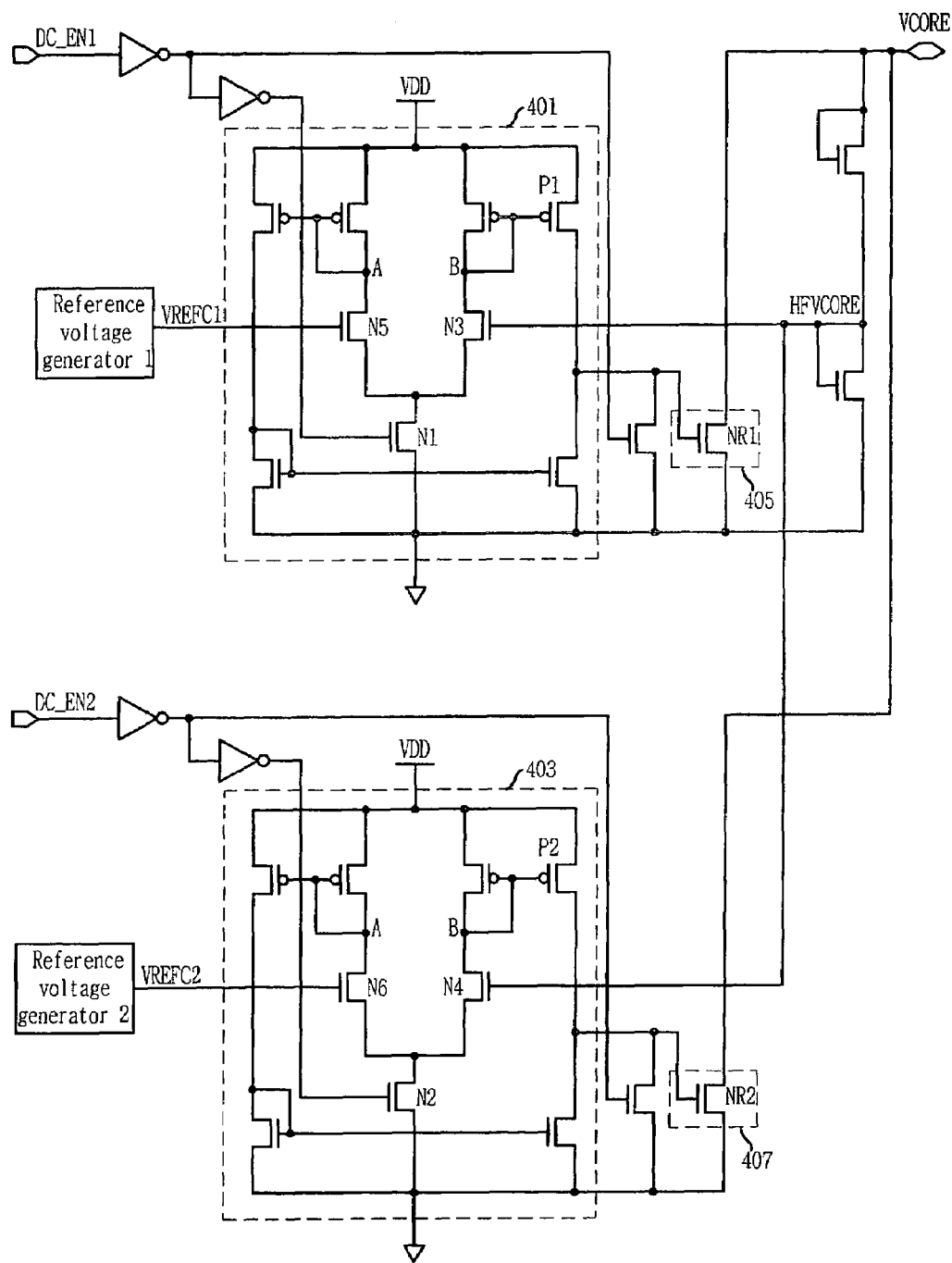
FIG. 4 is a schematic circuit diagram illustrating a core voltage generator in accordance with an embodiment of the present invention.

FIG. 4 is a schematic circuit diagram illustrating a core voltage generator in accordance with an embodiment of the present invention.

Referring to FIG. 4, the inventive core voltage generator includes a first comparator 401 for comparing a half core voltage HFVCORE that is ½ level of a core voltage at a core voltage terminal with a first reference voltage VREFC1, which is a ½ level of a target core voltage level, produced by a first reference voltage generator, a first discharge driver 405 for discharging the core voltage terminal in response to an output signal of the first comparator 401, a second comparator 403 for comparing the half core voltage HFVCORE with a second reference voltage VREFC2, which is ½ of a core rise limit level, provided by a second reference voltage generator, and a second discharge driver 407 for discharging the core voltage terminal on a large scale in response to an output signal of the second comparator 403.

In this arrangement, a first comparator enable signal DC_EN1 enabling the first comparator 401 is activated to a logic high level after the over driving operation is ended to apply an external power supply voltage to a pull-up power line, and maintained at the high level for a first time period for discharge. In a similar manner, a second comparator enable signal DC_EN2 as an enable signal of the second comparator 403 is also activated to a logic high level by rising at the falling edge of the overdriver enable signal to get the external supply voltage to the pull-up power line, and kept at the logic high level for a second time period to discharge. The first time period is longer than the second time period.

The first discharge driver 405 is composed of a first small-sized NMOS transistor NR1 and the second discharge driver 407 is composed of a second large-sized NMOS transistor NR2.

For operation in a case in which the voltage level at a core voltage terminal rises to a level that is less than a predetermined voltage level, i.e., a core rise limit voltage, the first and the second comparator enable signals DC_EN1 and DC_EN2 of logic high level turn on first and second NMOS transistors N1 and N2, thus enabling comparing elements of the first and second comparators 401 and 403.

Subsequently, input to gates of third and fourth NMOS transistors N3 and N4 is a half core voltage HFVCORE, which is ½ level of a core voltage at the core voltage terminal. Applied to gates of fifth and sixth NMOS transistors N5 and N6 are first and second reference voltages VREFC1 and VREFC2.

At this time, since the voltage level rise value at the core voltage terminal does not exceed the core rise limit voltage, the second comparator 403 provides an output signal of a logic low level. The second NMOS transistor NR2 of the second discharge driver 407, which has the output signal of the second comparator 403 applied to its gate, is not turned on, thereby causing no discharging operation.

At the same time, the first comparator 401 compares the first reference signal VREFC1 with the half core voltage HFVCORE, wherein the first PMOS transistor P1 is turned on and thus the output signal of the first comparator 401 becomes of a logic high level, since the first reference signal VREFC1 is less than the voltage level of the half core voltage HFVCORE.

Therefore, first NMOS transistor NR1 of the first discharge driver 405 is turned on by receiving the output signal of the first comparator 401, thereby causing discharge at the core voltage terminal VCORE.

At this time, since the size of the first NMOS transistor NR1 is small, a small-scale discharge occurs. Even with such a small-scale discharge, the risen core voltage VCORE can be lowered to the target core voltage level since the voltage rise value at the core voltage terminal is lower than the core rise limit voltage as mentioned above.

For operation in a case in which the value of the voltage level rise at the core voltage terminal is greater than the voltage level of the core rise limit voltage, the first and the second comparator enable signals DC_EN1 and DC_EN2, which rise at the falling edge of the overdriver enable signal of the sense amplifier, turn on the first and the second NMOS transistors N1 and N2, thus activating comparing elements of the first and second comparators 401 and 403.

Thereafter, input to gates of the third and fourth NMOS transistors N3 and N4 is the half core voltage HFVCORE, which is a ½ level of the core voltage. Applied to gates of the fifth and the sixth NMOS transistors N5 and N6 are the first and the second reference voltages VREFC1 and VREFC2.

At this time, since the voltage level rise value at the core voltage terminal exceeds the core rise limit voltage, the second comparator 403 produces an output signal of a logic high level, thus turning on the second NMOS transistor NR2 of the second discharge driver 407.

Therefore, discharge occurs at the core voltage terminal. Since the size of the second NMOS transistor NR2 at that time is large, large-scale discharging occurs, thereby abruptly lowering the voltage level at the core voltage terminal exceeding the core rise limit voltage level.

Simultaneously, the first comparator 401 compares the first reference signal VREFC1 with the half core voltage HFVCORE, wherein the first PMOS transistor P1 is turned on, since the first reference signal VREFC1 is less than a voltage level at the half core voltage terminal, and thus a logic level of the output signal of the first comparator 401 becomes a logic high.

Therefore, the first NMOS transistor NR1 of the first discharge driver 405 is turned on by receipt of the output signal of the first comparator 401, thereby resulting in discharge voltage at the core voltage terminal VCORE.

At this time, since a size of the first NMOS transistor NR1 is small, a small-scale discharge occurs.

The first and the second discharge drivers 405 and 407 simultaneously discharge the core voltage VCORE. The second discharge driver 407 is first disabled because an activation time of the second comparator enable signal DC_EN2 of the second comparator 403 is shorter than that of the first comparator enable signal DC_EN1 of the first comparator 401. Thereafter only the first discharge driver 405 is operated to discharge the voltage at the core voltage terminal. The reason why the second discharge driver 407 is first disabled is that the second NMOS transistor NR2 may introduce the ringing phenomenon if it is driven for a long term due to a large-scale discharge by virtue of the large size thereof. In addition, an enable time of the second discharge driver 407, that is, the second comparator enable signal DC_EN2 of the second comparator 403 should be inactivated after the core voltage rise value becomes lower than the core rise limit voltage level.

Figure 5:
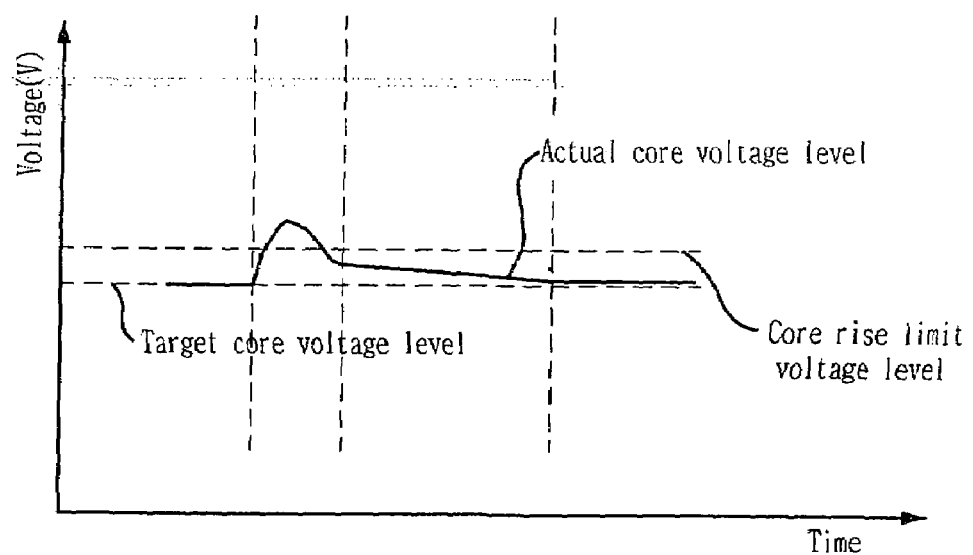
FIG. 5 is a graph showing a core voltage level when the discharge driver of FIG. 4 is driven.

The graph of FIG. 5 illustrates the voltage change.

As mentioned above, the semiconductor memory device of the invention is provided with a core voltage generator that enables large-scale discharge and small-scale discharge, to improve the inefficient discharging operation of the core voltage in the prior art.

Furthermore, the inventive core voltage generator first sets the core rise limit voltage level; and then lowers the voltage level at the core voltage terminal to the target core voltage level through the large-scale discharge and small-scale discharge if it rises above the limit voltage level and through only the small-scale discharge if it rises above the target core voltage but below the limit voltage level.

As a result, the present invention enables an effective discharge by setting a discharge efficiency depending on a voltage level at the core voltage terminal.

The logic types and arrangements employed in the above-described embodiments are exemplified with respect to the input and output signals all being in high active state. Therefore, if their active polarities are changed, the logic implementation should be also changed accordingly. The present invention can be embodied in various ways and modifications of the embodiments can be easily deduced by those skilled in the art to which the invention pertains. Thus, a detailed description of each case is omitted here.

In addition, while only one example has been explained, the invention is not so restricted as a core voltage generator may be implemented with a plurality of logic circuits.

The present application contains subject matter related to Korean patent application No. 2005-091688 and No. 2005-133987, filed with the Korean Intellectual Property Office on Sept.23, 2005 and on Dec. 29, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A core voltage generator in a semiconductor memory device, comprising:
    a first discharge driver for discharging a core voltage terminal for an interval during which the voltage at the core voltage terminal is higher than a target level, in response to a first enable signal activated for a first predetermined period after overdriving a bit line; and
    a second discharge driver for discharging the core voltage terminal for an interval during which the voltage at the core voltage terminal is higher than the target level by a predetermined threshold, in response to a second enable signal activated for a second predetermined period after overdriving the bit line, wherein the second predetermined period is shorter than the first predetermined period,
    wherein the first discharge driver and the second discharge driver simultaneously discharge the core voltage when the core voltage terminal is higher than the target level by the predetermined threshold.

2. The core voltage generator as recited in claim 1, wherein the second discharge driver has a large driving power compared to the first discharge driver.

3. The core voltage generator as recited in claim 2, wherein the first discharge driver includes:
    a comparator for comparing a ½ level of the voltage at the core voltage terminal with ½ of the target level; and
    a discharge driver for discharging the core voltage terminal in response to an output signal of the comparator.

4. The core voltage generator as recited in claim 1, wherein the second discharge driver includes:
    a comparator for comparing a ½ level of the voltage at the core voltage terminal with a ½ level of a core voltage rise limit voltage; and
    a discharge driver for discharging the core voltage terminal in response to an output signal of the comparator.

5. A core voltage generator for use in a semiconductor memory device, comprising:
    a first discharge driver for discharging a core voltage in response to a first enable signal; and
    a second discharge driver for discharging the core voltage in response to a second enable signal,
    wherein an active period of the second enable signal is shorter than an active period of the first enable signal,
    wherein the first discharge driver and the second discharge driver simultaneously discharge the core voltage when the core voltage is higher than a target level by a predetermined threshold.

6. The core voltage generator as recited in claim 2, wherein a driving force of the second discharge driver is greater than that of the first discharge driver.

7. A core voltage generator for use in a semiconductor memory device, comprising:
    a first discharge driver for discharging a core voltage in response to a first enable signal, the first discharge driver comprising a first discharge transistor controlled by the first enable signal; and
    a second discharge driver for discharging the core voltage in response to a second enable signal, the second discharge driver comprising a second discharge transistor controlled by the second enable signal,
    wherein a size of the second discharge transistor is larger than that of the first discharge transistor,
    wherein the first discharge driver and the second discharge driver simultaneously discharge the core voltage when the core voltage is higher than a target level by a predetermined threshold.

8. The core voltage generator as recited in claim 7, wherein an active period of the second enable signal is shorter than that of the first enable signal.

* * * * *